（12）United States Patent
Rudolf

(10) Patent No.: US 12,471,308 B2
(45) Date of Patent: Nov. 11, 2025

(54) SEMICONDUCTOR-ON-INSULATOR DEVICE WITH LIGHTLY DOPED EXTENSION REGION

(71) Applicant: Infineon Technologies Austria AG, Villach (AT)

(72) Inventor: Ralf Rudolf, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 431 days.

(21) Appl. No.: 17/939,011

(22) Filed: Sep. 7, 2022

(65) Prior Publication Data
US 2023/0075374 A1   Mar. 9, 2023

(30) Foreign Application Priority Data

Sep. 7, 2021   (EP) .................................... 21195259

(51) Int. Cl.
*H10D 30/60* (2025.01)
*H01L 21/762* (2006.01)
(Continued)

(52) U.S. Cl.
CPC ....... *H10D 30/601* (2025.01); *H01L 21/7624* (2013.01); *H10D 30/0285* (2025.01); *H10D 30/65* (2025.01); *H10D 62/10* (2025.01)

(58) Field of Classification Search
CPC ............. H01L 29/7833; H01L 21/7624; H01L 29/0603; H01L 29/66689; H01L 29/36; H01L 29/0657; H01L 29/0692; H01L 29/0696; H01L 29/0878; H01L 29/66681–66704; H01L 29/7816–7826; H01L 29/0649–0653; H01L 21/76264–76291; H01L 27/1203–1211;
(Continued)

(56) References Cited

U.S. PATENT DOCUMENTS

| 7,411,249 B1 | 8/2008 | Blanchard |
| 2007/0120187 A1 | 5/2007 | Udrea et al. |

(Continued)

OTHER PUBLICATIONS

Matsumoto, Satoshi, et al., "Failure Analysis and New Design of a Thin-Film Silicon-on-Insulator Power Metal-Oxide-Semiconductor Field-Effect Transistor Based on Emission Microscopy and 2-Dimensional Device Simulation", Japanese Journal of Applied Physics, vol. 34, No. 4A, Apr. 1, 1995, pp. 1790-1795.

*Primary Examiner* — Shahed Ahmed
(74) *Attorney, Agent, or Firm* — Murphy, Bilak & Homiller, PLLC

(57) ABSTRACT

A semiconductor device includes an insulator layer and a semiconductor layer formed on the insulator layer. The semiconductor layer includes a first region of a first conductivity type, a second region of a second conductivity type, and a lightly doped extension region of the first conductivity type separating the first region and the second region along a lateral x-axis. A dielectric structure laterally surrounds the semiconductor layer. At least one of the first region and the lightly doped extension region is formed at a distance to the dielectric structure along a lateral y-axis orthogonal to the x-axis. Along the x-axis and between the second region and the first region, a lateral extension of the semiconductor layer along the y-axis increases with increasing distance to the second region.

17 Claims, 11 Drawing Sheets

(51) Int. Cl.
  *H10D 30/01* (2025.01)
  *H10D 30/65* (2025.01)
  *H10D 62/10* (2025.01)

(58) Field of Classification Search
  CPC .. H10D 30/601; H10D 30/0285; H10D 62/10; H10D 30/0512; H10D 30/0275; H10D 30/202; H10D 62/157; H10D 62/126; H10D 62/127; H10D 62/159; H10D 30/0281–0289; H10D 30/65–659; H10D 86/201–215
  See application file for complete search history.

(56) References Cited

U.S. PATENT DOCUMENTS

| | | | | |
|---|---|---|---|---|
| 2014/0070312 A1* | 3/2014 | Yang | ............ | H01L 29/0878 |
| | | | | 257/E29.257 |
| 2015/0116029 A1* | 4/2015 | Litty | ............ | H03K 17/687 |
| | | | | 257/339 |
| 2021/0367073 A1* | 11/2021 | Snyder | ............ | H01L 29/402 |

* cited by examiner

SEMICONDUCTOR-ON-INSULATOR DEVICE WITH LIGHTLY DOPED EXTENSION REGION

TECHNICAL FIELD

Examples of the present disclosure relate to a semiconductor-on-insulator device with a semiconductor layer that includes a lightly doped extension region for electric field reduction. In particular, the semiconductor-on-insulator device may be an integrated circuit used in power electronics, e.g. a gate driver circuit.

BACKGROUND

Power electronic assemblies include power semiconductor switches such as IGBTs (insulated gate bipolar transistor) and/or MOSFETs (metal oxide semiconductor field effect transistor) for controlling inductive loads in power conversion circuits and motor control applications, as well as integrated circuits for controlling and monitoring the power semiconductor switches. An example for such an integrated circuit is the gate driver circuit which allows a microcontroller or digital signal processor (DSP) to efficiently turn on and turn off power semiconductor switches. A buffer stage of the gate driver circuit includes output transistors with low-level inputs that drive the comparatively high input current required to gate a power semiconductor switch. In gate driver circuits based on SOI (semiconductor-on-insulator) technology, each output transistor of each buffer stage may be formed in a thin semiconductor film with dielectric isolation on all sides. The dielectric insulation on all sides prevents latch-up and eliminates leakage currents to a bulk almost completely.

There is a constant need to further improve the device characteristics of power electronics devices at low additional effort.

SUMMARY

Embodiments of the present disclosure increase the breakdown strength and/or reduce the leakage current of an output transistor that supplies a gate signal for a power semiconductor switch without significantly increasing the active area.

To this purpose, an embodiment of the present disclosure relates to a semiconductor device that includes an insulator layer and a semiconductor layer formed on the insulator layer. The semiconductor layer includes a first region of a first conductivity type, a second region of a second conductivity type and a lightly doped extension region of the first conductivity type separating the first region and the second region along a lateral x-axis. A dielectric structure laterally surrounds the semiconductor layer. At least one of the first region and the extension region is formed at a distance to the dielectric structure along a lateral y-axis orthogonal to the x-axis. Along the x-axis and between the second region and the first region, a lateral extension of the semiconductor layer along the y-axis increases with increasing distance to the second region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other.

DETAILED DESCRIPTION

Figure 1A:
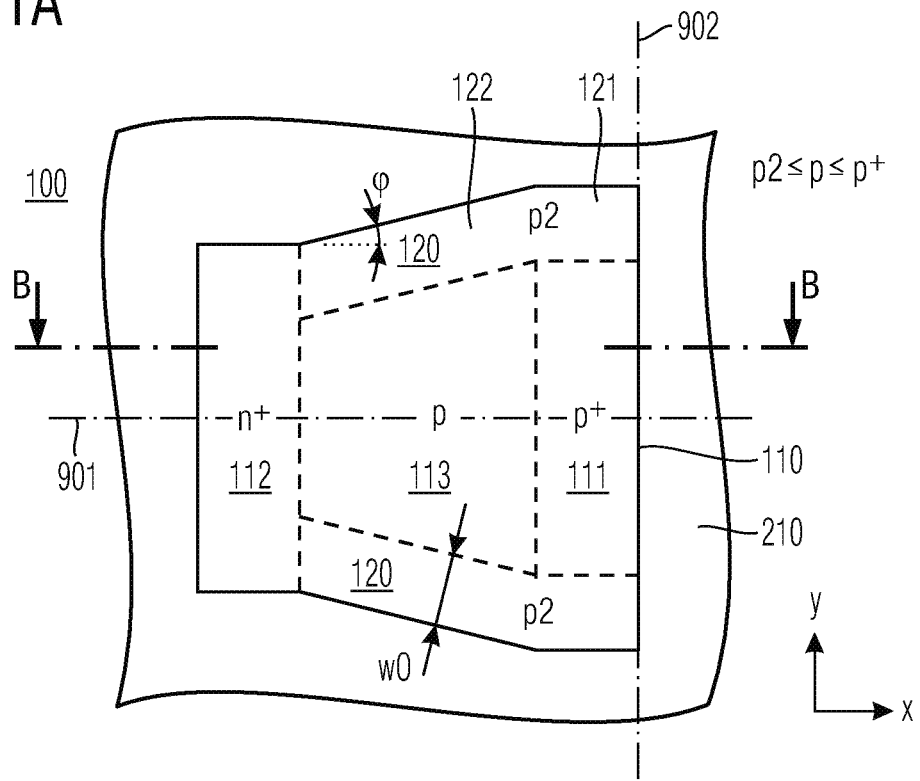
FIG. 1A is a schematic plan view of a semiconductor element formed in a semiconductor layer and including a lightly doped extension region formed at a distance to a semiconductor edge according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30 V, for example 100 V, 600 V, 1.6 kV, 3.3 kV or more and with a nominal on-state current or forward current of at least 1 A, for example 10 A or more.

An ohmic contact describes a non-rectifying electrical junction between two conductors, in particular between a semiconductor material and a metal. The ohmic contact has a linear or approximately linear current-voltage (I-V) curve in the first and third quadrant of the I-V diagram as with Ohm's law.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

According to an embodiment, a semiconductor device may include an insulator layer and a semiconductor layer formed on the insulator layer, wherein the semiconductor layer includes a first region of a first conductivity type, a second region of a second conductivity type and a lightly doped extension region of the first conductivity type separating the first region and the second region along a lateral x-axis. A dielectric structure laterally surrounds the semiconductor layer, In particular, the semiconductor layer and the insulator layer form part of an SOI structure. The insulator layer may have two substantially parallel main surfaces, which may have approximately the same shape and size. The insulator layer has a surface extent along two orthogonal axes (x-axis and y-axis) defining horizontal directions, and a thickness along a z-axis defining a vertical direction perpendicular to the horizontal directions. In the following, the horizontal directions are also referred to as lateral directions. The surface of the first semiconductor layer at a front side opposite to the insulator layer is referred to as the first surface.

The insulator layer has a uniform vertical extension and may be a homogenous layer, e.g. a silicon oxide layer. Alternatively, the insulator layer may include two or more vertically stacked sub-layers of different composition and/or structure. The insulator layer may have a vertical extension in a range from 200 nm to 2 μm, e.g., from 350 nm to 450 nm. A voltage blocking capability of the insulator layer may be in a range from 200V to 2000V, e.g., about 300V. The insulator layer may separate the semiconductor layer from a non-insulating base.

The semiconductor layer may be a layer of uniform thickness, wherein a thickness of the semiconductor layer along the vertical direction may be in a range from 50 nm to 2 μm, e.g. approximately 100 nm. The material of the semiconductor layer is a single-crystalline semiconductor, e.g. silicon.

In the semiconductor layer, the first region and the extension region form a unipolar junction. The extension region and the second region form a pn junction. The first region may have a dopant concentration sufficiently high such that a metal contact structure and the first region form a low-resistive ohmic contact.

The extension region has a significantly lower dopant concentration than the first region. For example, an average net dopant concentration in the extension region is at most 50%, at most 80% or at most 90% of an average net dopant concentration in the first region. The extension region and the second region form a pn junction with a comparatively high reverse breakdown voltage of at least 30V, e.g., at least 60V. In particular, the dopant concentration in the extension region and the lateral extension of the extension region along the x-axis are designed such that the electric field strength in the extension region is safely below the breakdown electric field in the semiconductor layer, when the nominal blocking voltage drops between the first region and the second region.

The first region, the second region and the extension region form doped regions of a semiconductor element formed in the semiconductor layer. The semiconductor element may be a semiconductor diode or an MOSFET, by way of example.

The dielectric structure may form a laterally closed frame around the semiconductor layer. The inner edge of such closed frame defines the outer edge of the semiconductor layer ("semiconductor edge"). The dielectric structure may include or may consist of thermally grown silicon oxide. For example, the dielectric structure may be formed by a LOCOS (local oxidation of silicon) process defining the lateral extension of the semiconductor layer. In addition or alternatively, the dielectric structure may include deposited dielectric material, e.g. one or more layers of silicon nitride, silicon oxide, dielectric polymer, undoped silicate glass, and/or doped silicate glass such as BSG (boron silicate glass), PSG (phosphorus silicate glass), BPSG, FSG (fluorine-doped silica glass).

Along a lateral y-axis orthogonal to the x-axis, at least one of the first region and the extension region may be formed at a distance to the dielectric structure. In particular, at least one of the first region and the extension region is spaced from the semiconductor edge.

In addition, a lateral extension of the semiconductor layer along the y-axis (y-extension) may increase with increasing distance to the second region at least between the second region and the first region. In particular, the y-extension of the semiconductor layer increases starting from the junction between the second region and the extension region to or at least to the junction between the extension region and the first region.

In particular, the lateral extension of the semiconductor layer along the y-axis may increase linearly or in a plurality of fine steps, wherein a step width is at most 50%, e.g. at most 10% or 1% of the distance between the first region and the second region.

Increasing the length of the semiconductor edge between the first region and the second region—without increasing the distance between the first region and second region—and spacing comparatively heavily doped regions from the significantly improves the voltage blocking capability of and/or the leakage current in the semiconductor element formed in the semiconductor layer.

Where otherwise interface states, segregated dopants, and other physical effects make voltage breakdown along the semiconductor edge more likely, a reduced number of dopants along the semiconductor edge combined with the longer distance along the semiconductor edge can, in the event of a voltage breakdown, cause the current flow to be distributed over a larger area in the central portion of the semiconductor element and in a distance from the semiconductor edge. This allows the breakdown voltage to be more precisely defined. In particular, the breakdown voltage and the leakage current behavior are more independent of process variations affecting the interface at the semiconductor edge.

While a voltage breakdown with a charge carrier flow concentrated along the semiconductor edge can lead to permanent damage along the semiconductor edge and degradation of device properties, the distribution of the charge carrier flow across the y-extension of the semiconductor layer can avoid permanent damage to the semiconductor crystal, and the semiconductor element can fully recover from the voltage breakdown.

For example, the semiconductor element formed in the semiconductor layer is a semiconductor diode with the first region forming the n doped cathode region, the second region forming the p doped anode region, and the extension region forming an n doped drain extension. Reducing the dopant concentration along the semiconductor edge and at the same time increasing the length of the semiconductor edge along the drain extension—without increasing the distance between the anode region and the cathode region—significantly improves the voltage blocking capability of and/or the reverse current behavior of the semiconductor diode formed in the semiconductor layer.

According to an embodiment, the semiconductor device may further include a source region of the conductivity type of the first region, wherein the source region, the second region, the extension region and the first region are formed in this order along the x-axis.

In particular, the semiconductor layer may include the semiconducting portion (active area) of an enhancement-type MOSFET, wherein the first region forms a MOSFET drain region, the second region forms a MOSFET body region, and the doped extension region forms a MOSFET drain extension. The body region (second region) laterally separates the source region and the drain extension (extension region). The body region (second region) and the drain extension (extension region) form a first a pn junction. The body region (second region) and the source region form a second pn junction. A gate electrode may control an MOS channel in the body region by capacitive coupling.

Reducing the dopant concentration along the semiconductor edge and at the same time increasing the length of the semiconductor edge along the drain extension—without increasing the distance between the source region and the drain region—significantly improves the voltage blocking capability of and/or the leakage current behavior of the MOSFET active area formed in the semiconductor layer.

According to an embodiment, the dielectric structure may extend through the semiconductor layer and may be in contact with the insulator layer.

In particular, an interface between the dielectric structure and the insulator layer may form a closed frame around the semiconductor layer. The semiconductor layer is formed exclusively within the closed frame. The closed frame and a portion of the insulator layer below the semiconductor layer form a dielectric box enclosing the semiconductor layer on five sides. The dielectric box reduces latch-up risk and leakage current.

The first region and the second region may be formed only in an upper portion of the semiconductor layer, wherein the semiconductor element is a PDSOI (partially depleted silicon-on-insulator) device.

According to an embodiment, the first region, the second region and the extension region may extend from a first surface at a front side of the semiconductor layer to the insulator layer.

In particular, the semiconductor element in the semiconductor layer is an FDSOI (fully depleted silicon-on-insulator) device.

In case the semiconductor layer includes the active area of an MOSFET with the first region forming the drain region, the second region forming the body region, and the extension region forming the drain extension, the source region may also extend form the first surface to the insulator layer.

According to an embodiment, the semiconductor device may further include a non-insulating base formed at a side of the insulator layer opposite to the semiconductor layer.

The non-insulating base may be or may include a semiconductor substrate. The semiconductor substrate may be homogenously doped or may include doped regions extending from the interface with the insulator layer into the semiconductor substrate. Alternatively or in addition, the non-insulating base may include a metal plate or a metal layer.

The non-insulating base, the insulator layer and the semiconductor layer are vertically stacked along the z-axis in this order.

According to an embodiment, the semiconductor device may include a first spacer region which is formed along the y-axis between the first region and the dielectric structure, wherein the first spacer region is intrinsic or has the first conductivity type with an average net dopant concentration of at most 10% of an average net dopant concentration in the first region.

In particular, the first spacer region may be part of the semiconductor layer and laterally separate the first region and the dielectric structure along the y-axis. A net dopant concentration in the first spacer region may be uniform or may decrease toward the semiconductor edge.

The first spacer region can help reduce the electric field and/or a charge carrier flow along the semiconductor edge between the first region and the second region under reverse bias and in this way can reduce the leakage current and/or increase the breakdown voltage.

According to an embodiment, the semiconductor device may include a second spacer region along the y-axis between the extension region and the dielectric structure, wherein the second spacer region is intrinsic or has the first conductivity type with an average net dopant concentration of at most 10% of an average net dopant concentration in the extension region.

In particular, the second spacer region may be part of the semiconductor layer and laterally separate the extension region and the dielectric structure along the y-axis. A net dopant concentration in the second spacer region may be uniform or may decrease toward the semiconductor edge.

The second spacer region can help reduce the electric field and/or a charge carrier flow along the semiconductor edge between the first region and the second region under reverse bias and in this way can reduce the leakage current and/or increase the breakdown voltage.

The second spacer region can be combined with the first spacer region. The first spacer region and the second spacer region may be laterally separated from each other.

According to an embodiment, the first spacer region and the second spacer region may be in direct contact with each other.

In particular, the second spacer region can be combined with the first spacer region such that a contiguous spacer region separates the dielectric structure from both the extension region and the first region. For example, the first spacer region and the second spacer region may have the same width and may form a contiguous spacer zone with at least approximately uniform dopant concentration. The width of the spacer zone may be uniform or may gradually decrease or increase with increasing distance to the second region.

According to an embodiment, the extension region may include a spacer portion between the first region and the dielectric structure. In particular, the spacer portion may separate the first region from the semiconductor edge.

The spacer portion may be part of the semiconductor layer and may laterally separate the first region and the dielectric structure. The spacer portion can help reduce the electric field along the semiconductor edge and the charge carrier flow along the semiconductor edge between the first region and the second region under reverse bias.

According to an embodiment, the spacer portion of the extension region may be formed at a distance to the dielectric structure along the y-axis.

In particular, the semiconductor layer may include a second spacer region that separates the extension region and the dielectric structure. An average dopant concentration in the second spacer region may be at most 50% or at most 10% of an average dopant concentration in the extension region.

A net dopant concentration in the second spacer region may be uniform or may decrease toward the semiconductor edge.

According to an embodiment, the lateral extension of the semiconductor layer along the y-axis increases with increasing distance to the second region from the second region to at least a center of the first region with respect to the x-axis.

The lateral extension of the semiconductor layer along the y-axis may increase linearly or in a plurality of fine steps, wherein the step width is at most 10%, e.g. at most 1% of the distance between the first region and the second region.

Between the first region and the second region, the lateral extension of the extension region along the y-axis may increase at the same rate as the lateral extension of the semiconductor layer.

Starting from the junction between the extension region and the first region in a direction away from the second region, the lateral extension of the first region along the y-axis may increase at the same rate as the lateral extension of the semiconductor layer. Alternatively, starting from the junction between the extension region and the first region in the direction away from the second region, the lateral extension of the spacer portion of the extension region along the y-axis may increase at the same rate as the lateral extension of the semiconductor layer.

In case of asymmetric semiconductor elements with the second region formed only at one side of the first region ("half-cell"), the lateral extension of the semiconductor layer along the y-axis may increase along the complete lateral extension of the first region along the x-axis. In case of semiconductor elements with an active area symmetric to a cell symmetry axis parallel to the y-axis and through the lateral center of the first region with respect to the x-axis, the lateral extension of the semiconductor layer along the y-axis may increase up to the lateral center of the first region.

In particular, the semiconductor layer may include two or four wedge-shaped portions. Each wedge-shaped portion is a right-angled triangle with a first leg coinciding with a first side of a rectangular inner portion of the semiconductor layer and with the hypotenuse forming a part of the outer edge of the semiconductor layer. An asymmetric semiconductor element ("half-cell") may include two first wedge-shaped portions formed mirror inverted to an axis of symmetry parallel to the x-axis. The second legs of the two first wedge-shaped portions form part of a straight section of the outer edge of the semiconductor layer.

For semiconductor elements with symmetric active area, the semiconductor layer further includes two second wedge-shaped portions, wherein each of the second wedge-shaped portions is symmetric to one of the first wedge-shaped portions with respect to a cell symmetry axis parallel to the y-axis, and wherein the second legs two adjoining wedge-shaped portions coincide. Each pair of a first wedge-shaped portion and a second wedge-shaped portion forms an isosceles triangle.

According to an embodiment, a width w3 of the extension zone between an outer edge of the semiconductor layer and the first region may be constant.

The width w3 is measured orthogonal to the outer edge and orthogonal to the junction between the first region and the extension region.

According to an embodiment, the width w3 may be at least 10% of a width w1 of the extension region between the first region and the second region.

For example, the width w3 of the extension region between the first region and the outer edge may be at least 50%, e.g. 70% of the width w1 of the extension region between the first region and the second region.

According to an embodiment, a second spacer region may separate the dielectric structure and the extension zone.

A width w2 of the second spacer region between the outer edge of the semiconductor layer and the extension region, in particular between the outer edge and the spacer portion of the extension region, may be constant. An average net dopant concentration in the second spacer region may be uniform or may decrease toward the semiconductor edge.

According to an embodiment, the semiconductor device may further include an n-MOSFET (n-channel MOSFET) including doped regions formed in a second semiconductor layer formed on the insulator layer. The first region, the second region and the extension region form doped regions of a p-MOSFET. The source/drain paths of the p-MOSFET and the n-MOSFET are electrically connected in series between a high potential line and a low potential line.

The second semiconductor layer and the first semiconductor layer are laterally separated. The p-MOSFET and the n-MOSFET may form part of a buffer stage that turns on and off the p-MOSFET and the n-MOSFET alternatingly, wherein at each point in time only one of the p-MOSFET and the n-MOSFET is in the on-state.

In particular, the semiconductor device may be a gate driver circuit that may include an input stage receiving an input signal at one or more input terminals INP. The input stage may pre-process the input signal and may transfer the pre-processed input signal to the buffer stage. The p-MOSFET and the n-MOSFET may form a push-pull output with the p-MOSFET and the n-MOSFET alternately supplying current to, or absorbing current from, a load connected to a network node between the p-MOSFET and the n-MOSFET. For example, the buffer stage may be capable of supplying at least 1 mA, e.g. at least 10 mA, and sinking at least 1 mA, e.g. at least 10 mA.

Figure 1B:
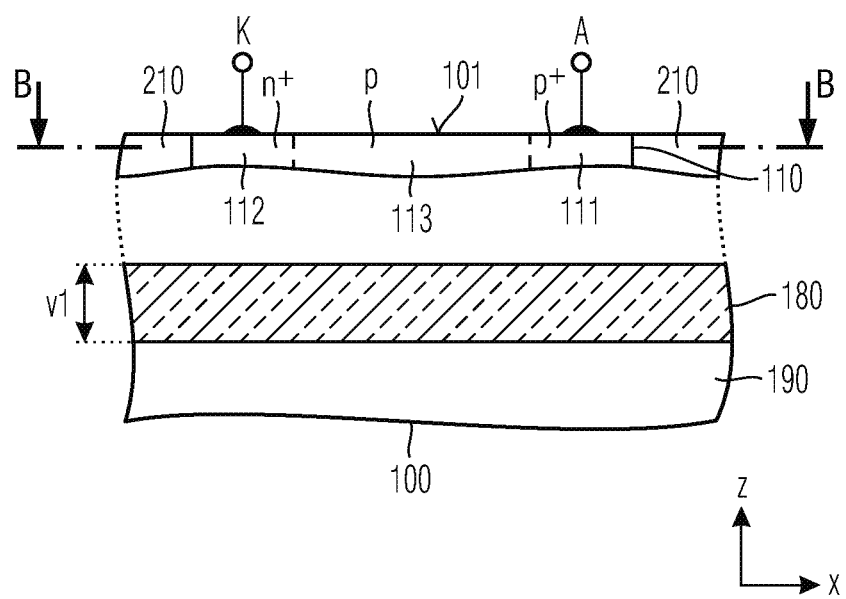
FIG. 1B is a schematic vertical cross-sectional view of the semiconductor element of FIG. 1A along line B-B.

FIG. 1A and FIG. 1B show a semiconductor device 100 with an SOI structure. An insulator layer 180 is formed on a non-insulating base 190. A semiconductor layer 110 is formed on the insulator layer 180. The non-insulating base 190, the insulator layer 180 and the semiconductor layer 110 are vertically stacked on each other and form the SOI structure. The insulator layer 180 extends parallel to a horizontal plane spanned by an x-axis parallel to a current flow direction in the on-state of the semiconductor device and by a y-axis orthogonal to the x-axis and the current flow direction.

A vertical extension v1 of the insulator layer 180 is in a range from 200 nm to 2 µm, e.g. from 350 nm to 450 nm. A voltage blocking capability of the insulator layer 180 is in a range from 200V to 2000V, e.g. about 300V.

The semiconductor layer 110 includes a first region 111 of a first conductivity type, a second region 112 of a complementary second conductivity type and a lightly doped extension region 113 of the first conductivity type. The extension region 113 separates the first region 111 and the second region 112 along the x-axis.

A dielectric structure 210 laterally surrounds the semiconductor layer 110 and separates the semiconductor layer 110 in the lateral directions from further semiconducting structures formed on the insulator layer 180. The dielectric structure 210 may include or may consist of thermally grown silicon oxide and may be formed by a LOCOS process that defines the lateral extension of the semiconductor layer 110.

The first region 111 and the extension region 113 are formed at a distance to the dielectric structure 210 along the y-axis. In particular, spacer zones 120 separate the first region 111 and the extension region 113 from the semiconductor edge between the semiconductor layer 110 and the dielectric structure 210. The spacer zones 120 are formed symmetric with respect to an axis of symmetry 901 parallel to the x-axis.

The spacer zones 120 may be intrinsic or may have the first conductivity type, wherein an average dopant concentration in the spacer zones 120 is at most 10% of the average dopant concentration in the first region 111.

Between the second region 112 and the first region 111, a lateral extension of the semiconductor layer 110 along the y-axis linearly increases with increasing distance to the second region 112. In particular, the increase is symmetric with respect to the axis of symmetry 901 parallel to the x-axis. An angle φ between the x-axis and the semiconductor edge between the second region 112 and the first region 111 may be in a range from 15° to 75°, e.g. between 30° and 60°. The width w0 of the spacer zones 120 orthogonal to the semiconductor edge is uniform. The lateral extension of the extension region 113 increases at the same rate the lateral extension of the semiconductor layer 110 increases.

The doped regions formed in the semiconductor layer 110 form a semiconductor diode.

In the illustrated example, the first region 111 is p doped, forms an anode region and is electrically connected with an anode metallization A. The second region 112 is n doped, forms a cathode region and is electrically connected with a cathode metallization K. The extension region 113 is p doped and the spacer zone is intrinsic or p doped.

According to another example, (not illustrated), the first region 111 is n doped, forms a cathode region and is electrically connected with a cathode metallization. The second region 112 is p doped, forms an anode region and is electrically connected with an anode metallization. The extension region 113 is n doped and the spacer zone is intrinsic or n doped.

The semiconductor diode may be configured as the bootstrap diode of a gate driver circuit for power semiconductor devices in a half bridge configuration.

Another semiconductor diode can be obtained from the illustrated semiconductor diode by adding a mirror image configuration of the illustrated semiconductor diode to the illustrated semiconductor diode at one of the two semiconductor edges parallel to the y-axis, as indicated by the possible symmetry axis 902.

Figure 2A:
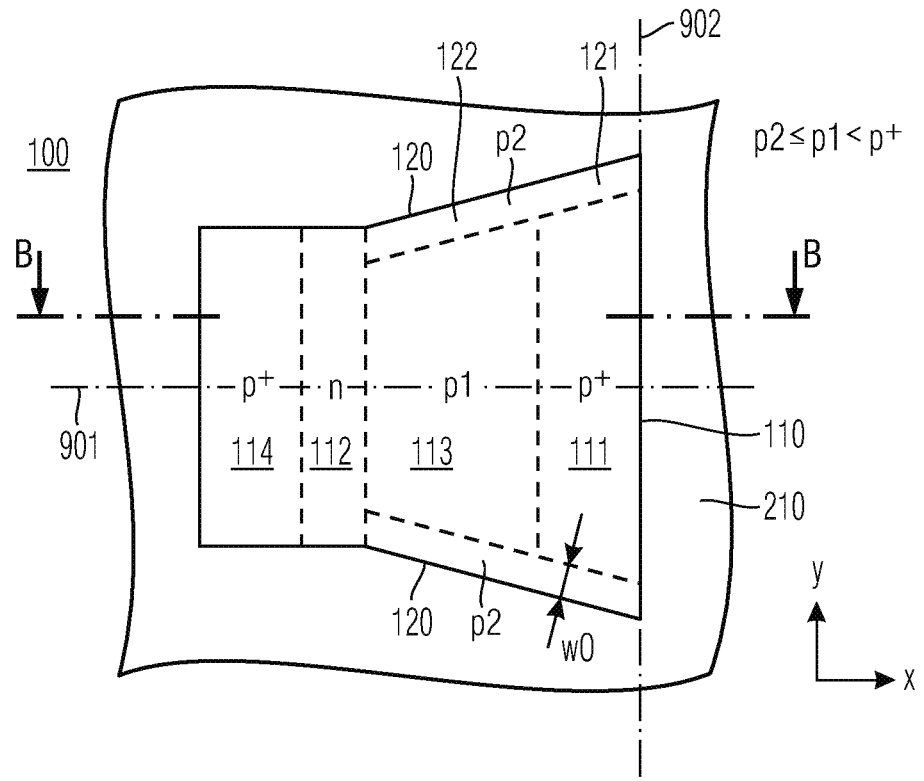
FIG. 2A is a schematic plan view of a semiconductor element according to an embodiment related to a p-MOSFET (p channel MOSFET).
Figure 2B:
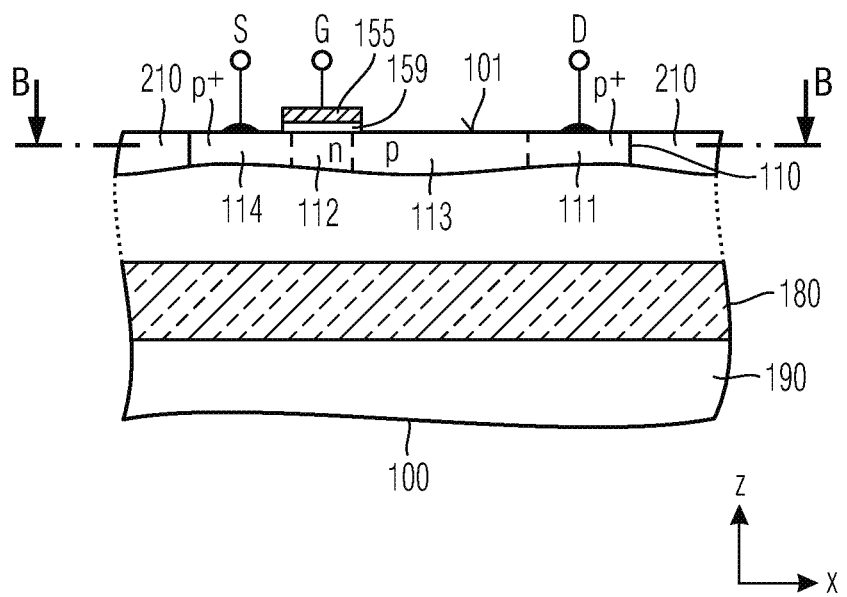
FIG. 2B is a schematic vertical cross-sectional view of the semiconductor element of FIG. 2A along line B-B.

In FIG. 2A and FIG. 2B the semiconductor element formed in the semiconductor layer 110 is a p-channel MOFET (metal oxide semiconductor field effect transistor) with a p doped source region 114 electrically connected to a source metallization S. The first region 111 forms a p doped drain region and is electrically connected to a drain metallization D. The second region 112 forms an n doped body region that separates the source region 114 and the extension region 113. The source region 114, the body region (second region 112), the extension region 113 and the drain region (first region 111) are formed in this order along the x-axis. A gate dielectric 159 separates a conductive gate electrode 155 and the body region (second region 112).

Starting from the second region 112 and in direction to the first region 111, a lateral extension of the semiconductor layer 110 along the y-axis linearly increases with increasing distance to the second region 112. The increase is symmetric with respect to the axis of symmetry 901 parallel to the x-axis.

Spacer zones 120 separate the drain region (first region 111) and the extension region 113 from the semiconductor edge between the semiconductor layer 110 and the dielectric structure 210. The spacer zones 120 are formed symmetric with respect to an axis of symmetry 901 parallel to the x-axis. The spacer zones 120 may be intrinsic or may be p doped, wherein an average dopant concentration in the spacer zones 120 is at most 10% of the average dopant concentration in the first region 111.

The width w0 of the spacer zones 120 orthogonal to the semiconductor edge is uniform. The lateral extension of the extension region 113 and the drain region (first region 111) increases at the rate the lateral extension of the semiconductor layer 110 increases.

Another example of a p-MOSFET can be obtained from the illustrated p-MOSFET by adding a mirror image configuration of the illustrated p-MOSFET to the illustrated p-MOSFET at one of the two semiconductor edges parallel to the y-axis, as indicated by the possible symmetry axis 902.

According to another example, (not illustrated), the first semiconductor layer 110 includes doped regions of an n-MOSFET, with n doped drain region (first region 111), n doped source region 114, p doped body region (second region 112), n doped extension region 113 and intrinsic or n doped spacer zones 120.

Figure 3:
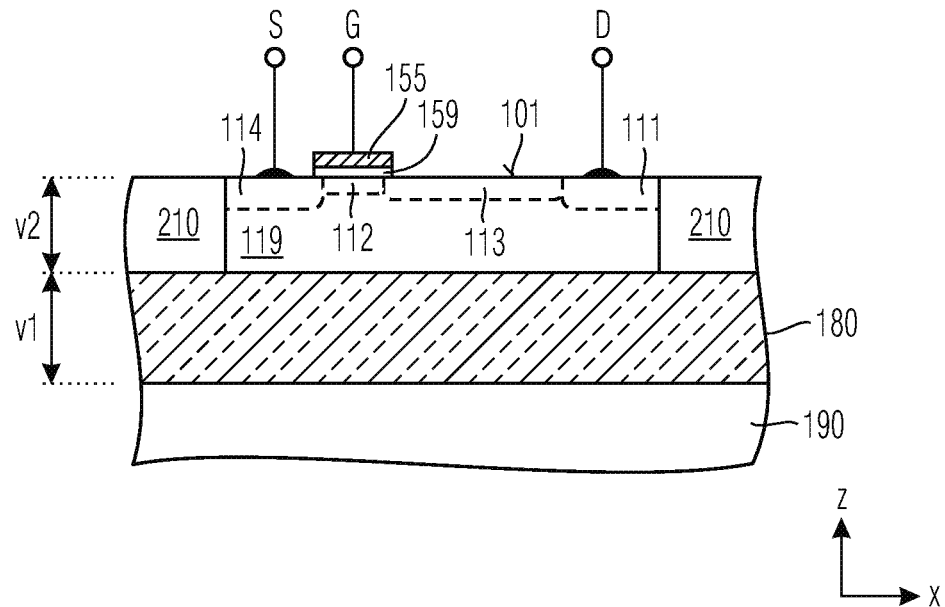
FIG. 3 is a schematic vertical cross-sectional view of a portion of a semiconductor device according to an embodiment referring to PDSOI (partially depleted silicon-on-insulator) devices.

FIG. 3 shows a PDSOI device with the drain region (first region 111), the extension region 113, the body region (second region 112) and the source region 114 formed as doped wells extending from a first surface 101 at the front side of the semiconductor layer 110 into an upper portion of the semiconductor layer 110. A bulk portion 119 separates the doped wells from the insulator layer 180. Alternatively, a section of the bulk portion 119 may form the extension region 113. A vertical extension v2 of the semiconductor layer 110 of a PDSOI semiconductor element may have any value within the above mentioned range for the vertical extension of the semiconductor layer from 50 nm to 2000 µm.

Figure 4:
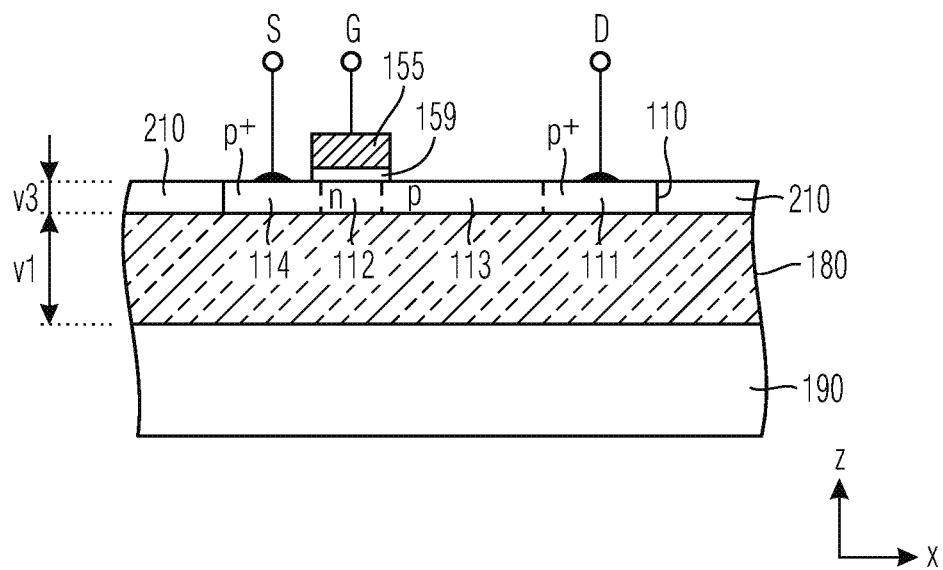
FIG. 4 is a schematic vertical cross-sectional view of a portion of a semiconductor device according to an embodiment referring to FDSOI (fully depleted silicon-on-insulator) devices.

FIG. 4 concerns an FDSOI device with the drain region (first region 111), the extension region 113, the body region (second region 112) and the source region 114 extending from the first surface 101 at the front side of the semiconductor layer 110 down to the insulator layer 180. A vertical extension v3 of the semiconductor layer 110 of an FDSOI semiconductor element may be in the lower part of the above mentioned range for the vertical extension of the semiconductor layer, e.g. in a range from 50 nm to 100 nm, or from 5 nm to 100 nm.

Figure 5:
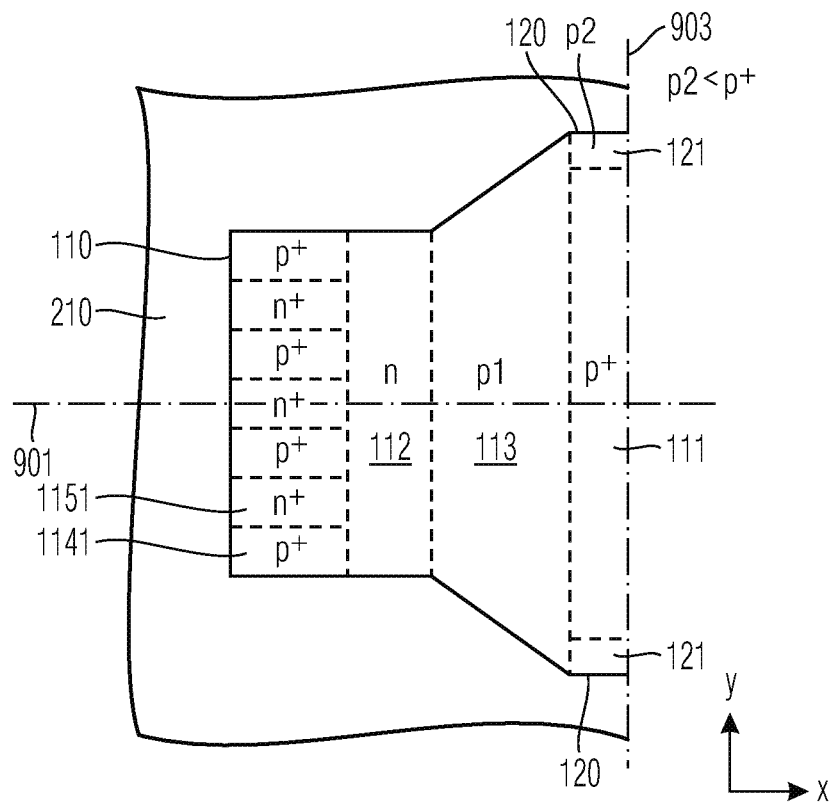
FIG. 5 is a schematic plan view of a semiconductor element according to an embodiment related to a first spacer region between first region and semiconductor edge.

FIG. 5 shows a half of a semiconductor layer 110 with doped regions formed symmetrically with respect to a central symmetry axis 903 parallel to the y-axis. In each half of the semiconductor layer 110 a source region 114 is formed that includes a plurality of source contact regions 1141 laterally separated along the y-axis by body contact regions 1151. The source contact regions 1141 and body contact regions 1151 are electrically connected with the source metallization S illustrated in FIG. 2B, FIG. 3 and FIG. 4.

Each of two spacer zones 120 formed in the semiconductor layer 110 includes a first spacer region 121 that separates the first region 111 from the semiconductor edge between the semiconductor layer 110 and the dielectric structure 210. The extension region 113 is in contact with the semiconductor edge. The first spacer regions 121 are symmetric with respect to an axis of symmetry 901 parallel to the x-axis. Each first spacer region 121 forms a rectangle with a width w1. An average dopant concentration in the first spacer regions 121 is at most 10% of an average dopant concentration in the first region 111.

Between the second region 112 and the first region 111, a lateral extension of the semiconductor layer 110 along the y-axis linearly increases with increasing distance to the second region 112. The lateral extension of the extension region 113 increases at the rate the lateral extension of the semiconductor layer 110 increases.

Figure 6:
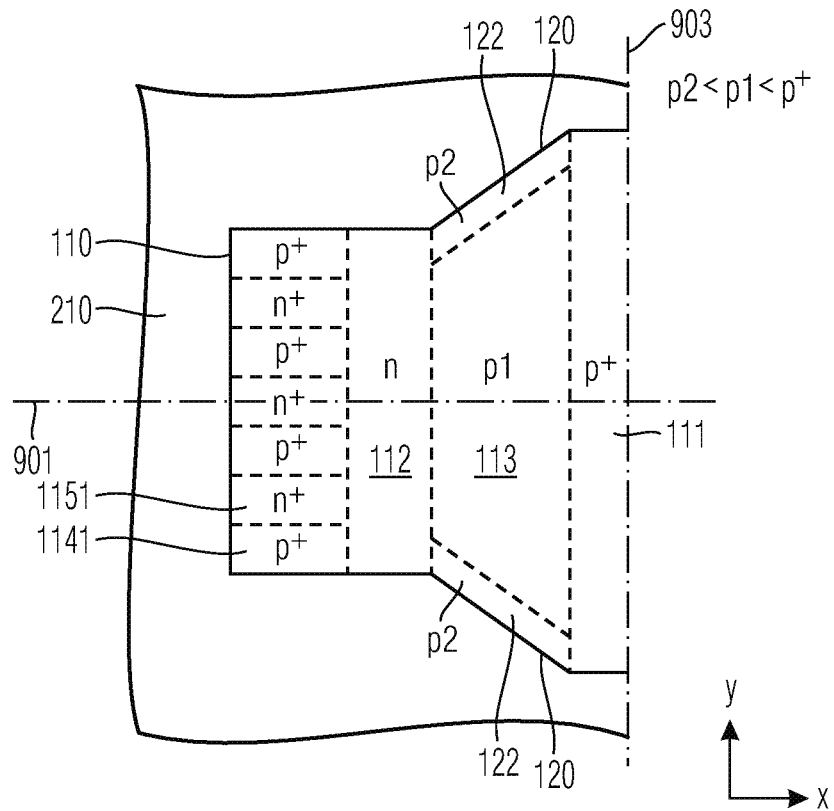
FIG. 6 is a schematic plan view of a semiconductor element according to an embodiment related to a second spacer region between extension region and semiconductor edge.

In FIG. 6, each spacer zone 120 includes a second spacer region 122 that separates the extension region 113 from the semiconductor edge. The drain region (first region 111) may be in contact with the semiconductor edge. The second spacer regions 122 are formed symmetric with respect to an axis of symmetry 901 parallel to the x-axis. Each second spacer region 122 forms a parallelogram. An average dopant concentration in the second spacer regions 122 is at most 50%, e.g. at most 10% of an average dopant concentration in the extension region 113.

Between the second region 112 and the first region 111, a lateral extension of the semiconductor layer 110 along the y-axis linearly increases with increasing distance to the second region 112. The lateral extension of the extension region 113 increases at the rate the lateral extension of the semiconductor layer 110 increases.

Another embodiment (not illustrated) combines the first spacer regions 121 of FIG. 5 and the second spacer regions 122 of FIG. 6 in the same semiconductor layer 110.

Figure 7:
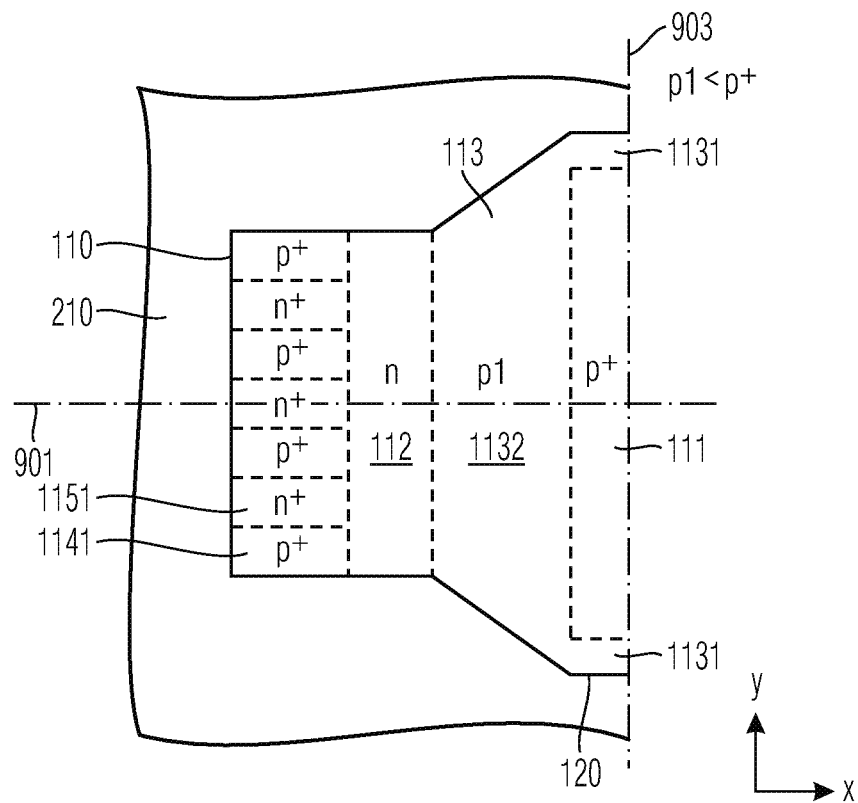
FIG. 7 is a schematic plan view of a semiconductor element according to an embodiment concerning an extension region including a spacer portion between first region and semiconductor edge.

The semiconductor element formed by the doped regions in the semiconductor layer 110 of FIG. 7 differs from that in FIG. 5 in that the first spacer region contains the same dopant concentration as the extension region 113.

In particular, the extension region 113 includes a main portion 1132 between the body region (second region 112) and the drain region (first region 111), and spacer portions 1131 between the first region 111 and the dielectric structure 210. The extension region 113 is a one-part structure with the main portion 1132 and the spacer portions 1131 being in direct contact with each other and forming a contiguous doped region.

Figure 8:
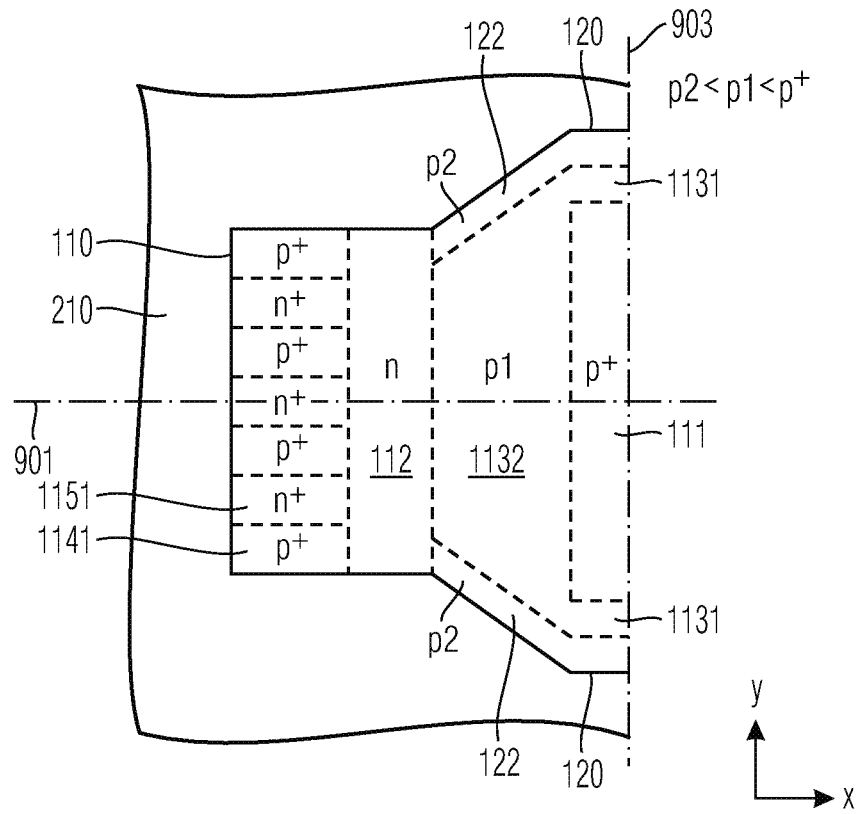
FIG. 8 is a schematic plan view of a semiconductor element according to an embodiment concerning a second spacer region between an extension region spacer portion and semiconductor edge.

The semiconductor element formed by the doped regions in the semiconductor layer 110 of FIG. 8 combines an extension region 113 with main portion 1132 and spacer portions 1131 as illustrated in FIG. 7 with a spacer region 120 as illustrated in FIG. 1A.

Figure 9:
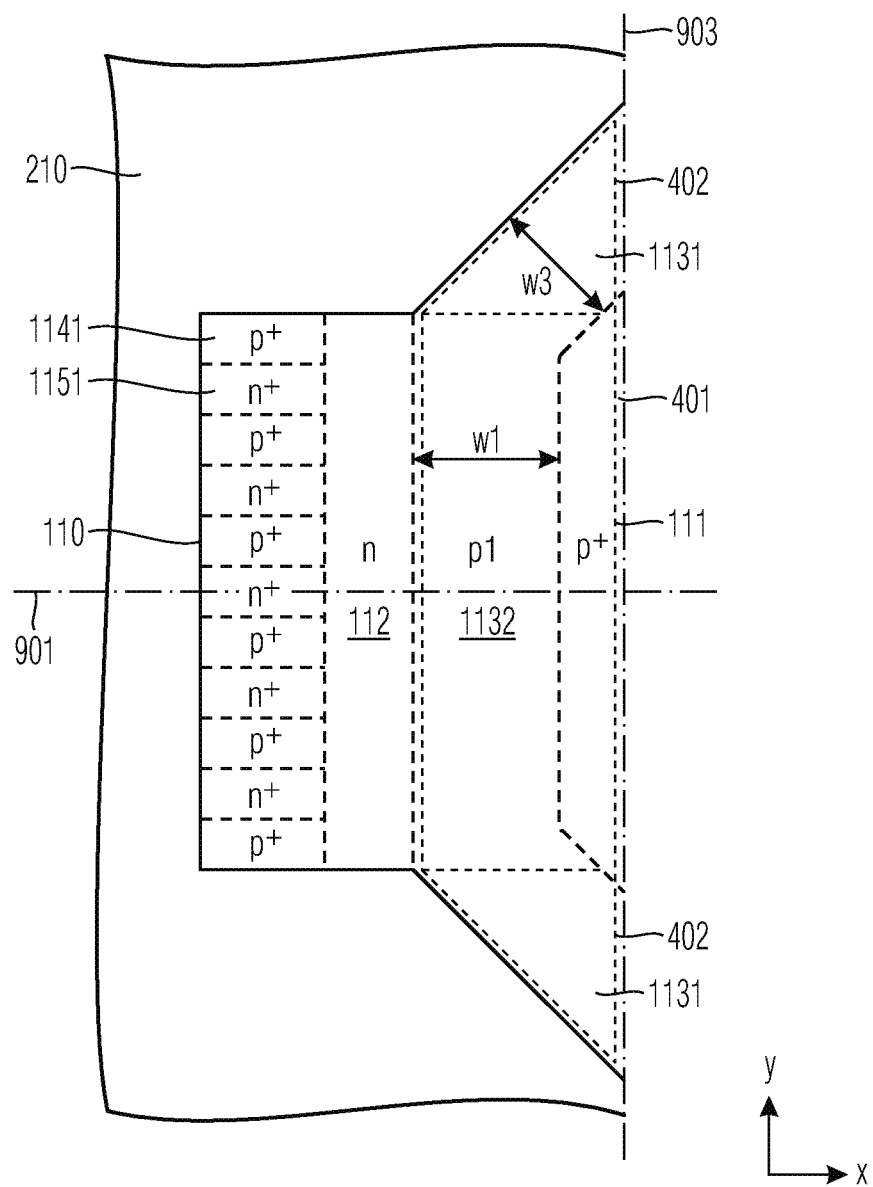
FIG. 9 is a schematic plan view of a p-MOSFET half-cell including an extension region with triangular or trapezoidal spacer portions according to a further embodiment.
Figure 10:
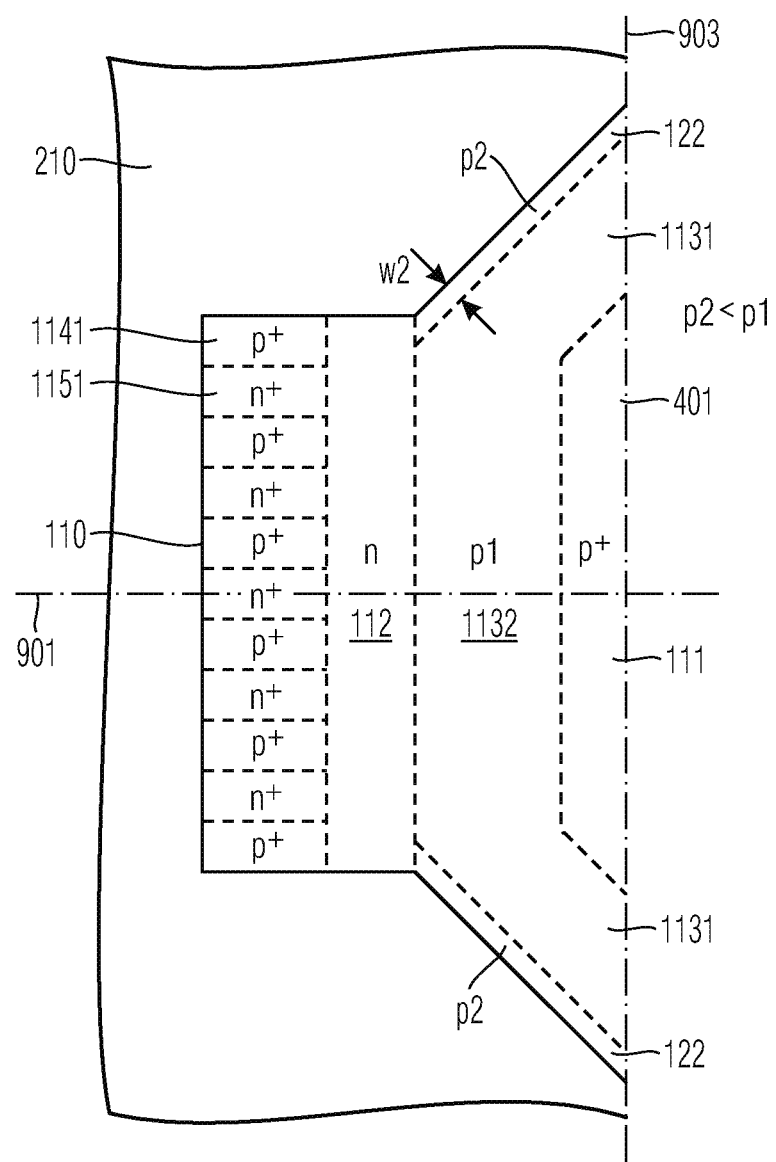
FIG. 10 is a schematic plan view of a p-MOSFET half-cell including an extension region with triangular or trapezoidal spacer portions and spacer regions according to a further embodiment.

FIG. 9 and FIG. 10 concern semiconductor elements which are formed symmetrically with respect to a central symmetry axis 903 parallel to the y-axis and to an axis of symmetry 901 parallel to the x-axis. From the junction between the body region (second region 112) and the extension region 113, the lateral extension of the semiconductor layer along the y-axis increases up to the central symmetry axis 903 parallel to the y-axis.

In particular, the semiconductor layer 110 includes a rectangular inner portion 401 and four wedge-shaped portions 402 extending in the horizontal plane outwardly from the rectangular inner portion 401. Each wedge-shaped portion 402 forms a right-angled triangle with a first leg coinciding with a half of a side of the rectangular inner portion 401 and with the hypotenuse forming a part of the outer edge of the semiconductor layer 110. The second legs of two adjoining wedge-shaped portions 402 coincide.

In FIG. 9, the extension region 113 includes a main portion 1132 between the body region (second region 112) and the drain region (first region 111) along the x-axis, and spacer portions 1131 between the first region 111 and the dielectric structure 210. Each wedge-shaped portion 402 includes a spacer portion 1131.

In FIG. 10, spacer zones 120 with a width w2 and with an average net dopant concentration lower than in the extension region 113 laterally separate the extension region 113 from the semiconductor edge along the dielectric structure 210. Each wedge-shaped portion 402 includes a spacer portion 1131 and a spacer zone 120.

Figure 11A:
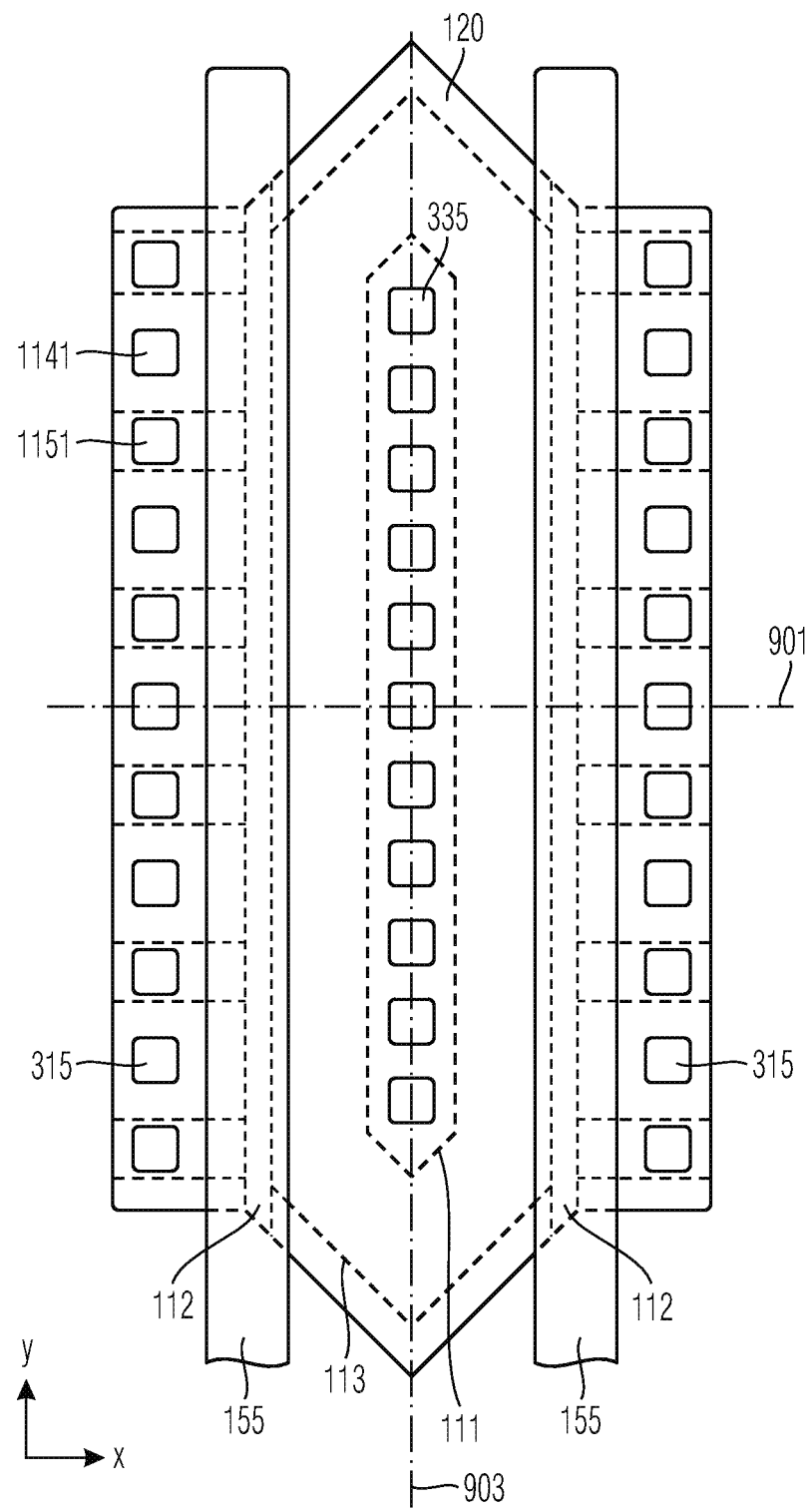
FIG. 11A is a schematic plan view of a p-MOSFET including an extension region with triangular or trapezoidal spacer portions and spacer regions according to a further embodiment.
Figure 11B:
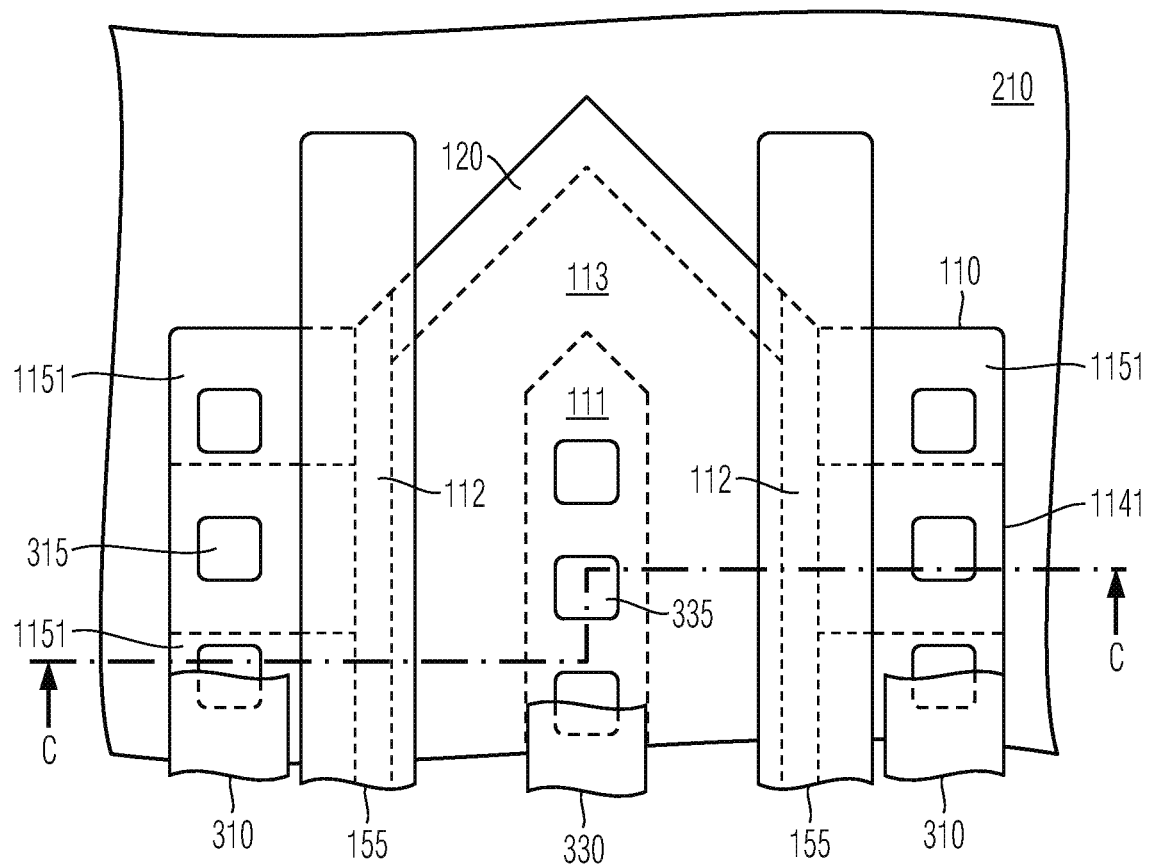
FIG. 11B shows a detail of the p-MOSFET of FIG. 11A.
Figure 11C:
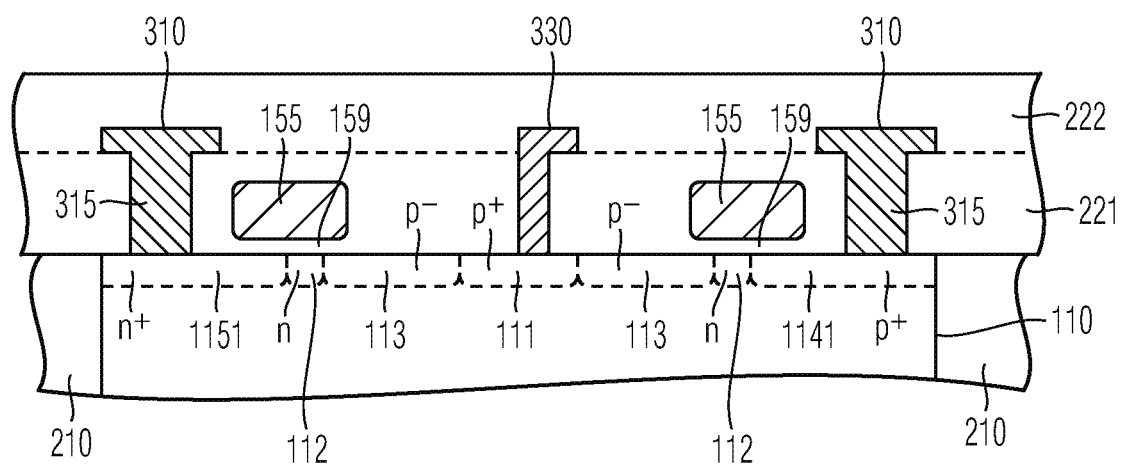
FIG. 11C is a schematic vertical cross-sectional view of the p-MOSFET of FIG. 11A along line C-C in FIG. 11B.

FIG. 11A, FIG. 11B and FIG. 11C illustrate another p-MOSFET with doped regions formed symmetrically with respect to a central symmetry axis 903 parallel to the y-axis and to an axis of symmetry 901 parallel to the x-axis.

The lateral extension of the drain region (first region 111) along the y-axis decreases starting from the central symmetry axis 903. An extension region 113 with approximately uniform width laterally surrounds the drain region (first region 111) and separates the drain region from two n doped body regions (second region 112) formed on opposite sides of the drain region with respect to the central symmetry axis 903. Each body region (second region 112) separates the extension region 113 from a row of p doped source contact regions 1141 separated by n doped body contact regions 1151. The source contact regions 1141 and the body regions form pn junctions. The body contact regions 1151 and the body regions form unipolar junctions. Between the two body regions (second regions 112) two spacer zones 120 separate the extension region 113 from the dielectric structure 210.

Stripe-shaped conductive gate electrodes 155 are formed above the body regions (second regions 112) and electrically connected to a gate metallization G. The gate electrodes 155 slightly overlap with the source contact regions 1141 and with the extension regions 113. A gate dielectric 159 formed on the semiconductor layer 110 separates the gate electrode from the body regions (second regions 112).

An interlayer dielectric 221 covers the gate electrodes 155 and the first semiconductor layer 110. Source connection lines 310 are formed on the interlayer dielectric 221 directly above the source contact regions 1141 and the body contact regions 1151. A drain connection line 330 is formed on the interlayer dielectric 221 directly above the drain region (first region 111).

Two rows of source contact structures 315 extend from the source connection line 310 through the interlayer dielectric 221 and electrically connect the source contact regions 1141 and the body contact regions 1151 with the source connection line 310. A row of drain contact structures 335 extend from the drain connection line 330 through the interlayer dielectric 221 and electrically connect the drain region (first region 111) with the drain connection line 330. A dielectric passivation layer 222 may cover the source connection lines 310 and the drain connection line 330.

From the junction between the body region (second region 112) and the extension region 113, the lateral extension of the semiconductor layer 110 increases up to the central symmetry axis 903 parallel to the y-axis.

Figure 12A:
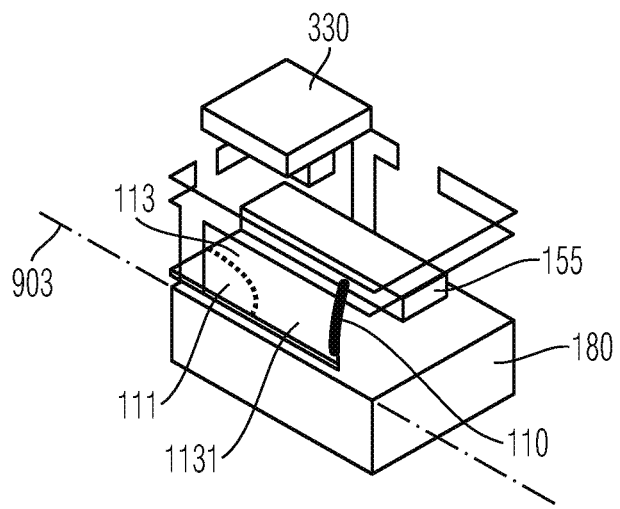
FIG. 12A is a schematic perspective view on a portion of a p-MOSFET half-cell without spacer region.

FIG. 12A shows the end portion of a first p-MOSFET with an extension region 113 including a spacer portion 1131 and with increasing lateral extension orthogonal to the current flow direction.

Figure 12B:
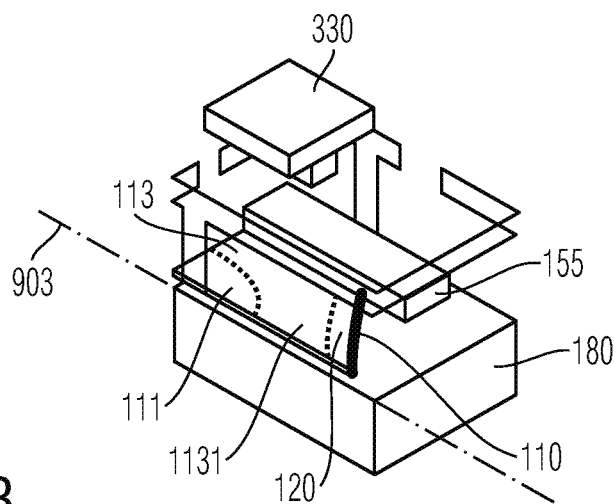
FIG. 12B is a schematic perspective view on a portion of a p-MOSFET half-cell with spacer region.

FIG. 12B shows the end portion of a second p-MOSFET that differs from the first p-MOSFET in FIG. 12A in that the second p-MOSFET includes a spacer zone 120 between the extension region 113 and the semiconductor edge.

Figure 12C:
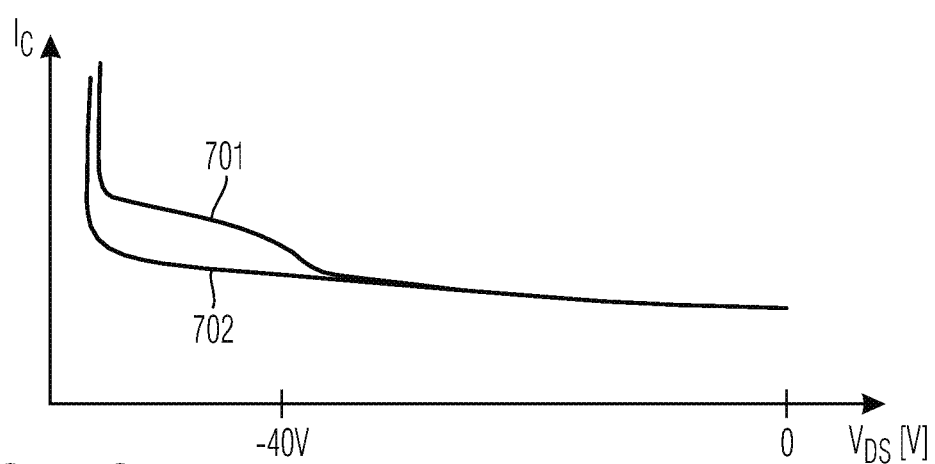
FIG. 12C is a diagram schematically illustrating U/I characteristics of the p-MOSFETs of FIG. 12A and FIG. 12B.

In FIG. 12C line 701 shows the breakdown characteristic for the first p-MOSFET of FIG. 12A and line 702 shows the breakdown characteristic for the second p-MOSFET of FIG. 12B at logarithmic scale. Line 701 indicates a significant rise of the leakage current prior to breakdown for the first p-MOSFET. In contrast, line 702 indicates that no such leakage current increase is observed for the second p-MOSFET of FIG. 12B.

Figure 13:
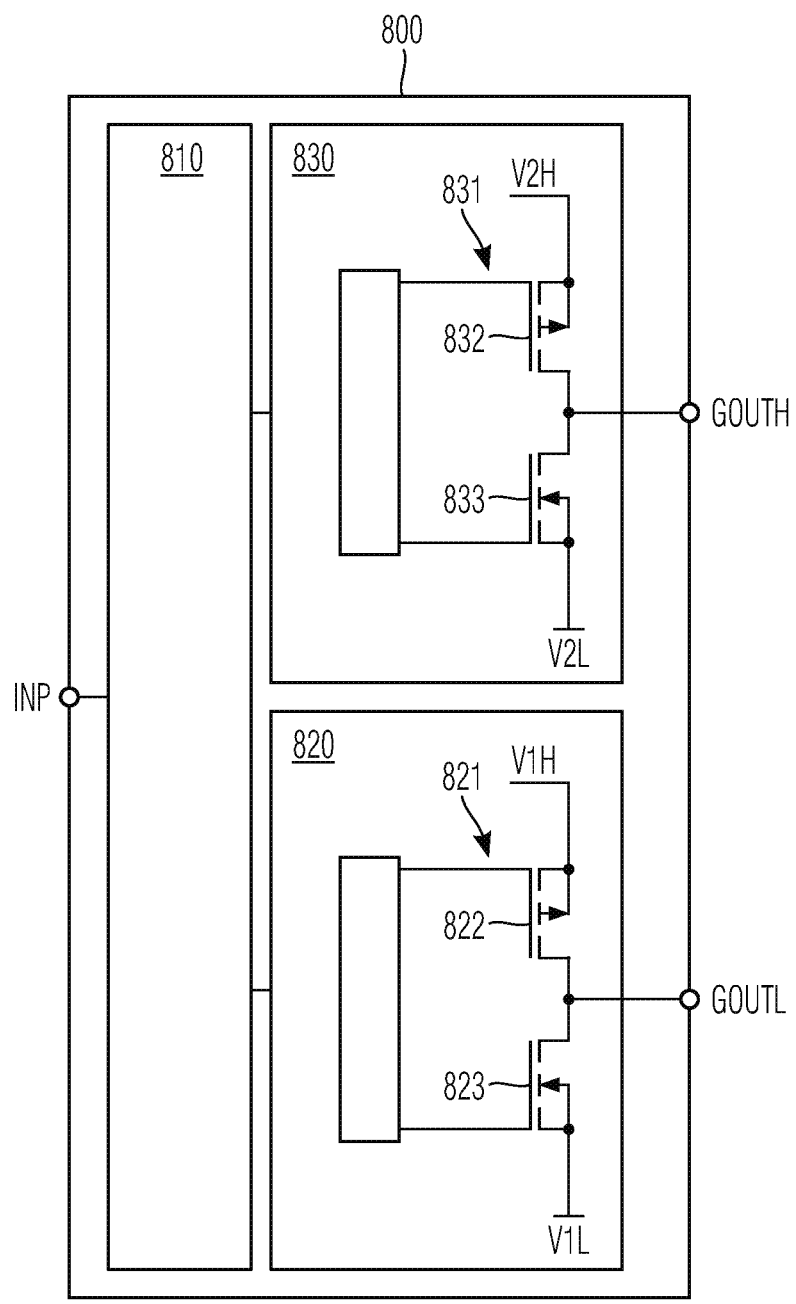
FIG. 13 is a schematic block diagram of a gate driver circuit according to an embodiment.

FIG. 13 shows building blocks of a gate driver circuit 800. The gate driver circuit 800 enables a micro-controller or digital signal processor (DSP) to efficiently turn on and turn off power semiconductor switches such as IGBTs or MOSFETs in power conversion circuits and motor control application.

The gate driver circuit 800 is configured as a half-bridge gate driver device that includes an input stage 810, a first gate driver stage 820 and a second gate driver stage 830. The input stage 810 receives an input signal at one or more input terminals INP. The input signal may include square pulses and may be received from a pulse width modulator circuit. The input stage 810 may pre-process the input signal and may transfer the pre-processed input signal to the first and second gate driver stages 820, 830 which may be electrically insulated from the input stage 810.

The first gate driver stage 820 includes a first buffer stage 821. In response to the received pre-processed input signal, the first buffer stage generates and drives a first gate signal for a first voltage controlled switching device, e.g. the low-side switch of a half-bridge assembly, and outputs the first gate signal at a first gate output terminal GOUTL.

The second gate driver stage 830 includes a second buffer stage 831. In response to the received pre-processed input signal, the second gate driver stage 830 generates and drives a second gate signal for a second voltage controlled switching device, e.g. the high-side switch of a half-bridge assembly, and outputs the second gate signal at a second gate output terminal GOUTH.

The first buffer stage 821 and/or the second buffer stage 831 include an inverter stage, e.g. a push-pull driver, with the source/drain paths of a p-MOSFET 822, 832 and an n-MOSFET 823, 833 electrically connected in series between a high potential line V1H, V2H and a low potential line V1L, V2L of the respective stage.

The network node between the p-MOSFET 822 and n-MOSFET 823 of the first buffer stage 821 is electrically connected with the first gate output terminal GOUTL. The network node between the p-MOSFET 832 and n-MOSFET 833 of the second buffer stage 831 is electrically connected with the second gate output terminal GOUTH.

In each buffer stage 821, 831, the p-MOSFET 822, 832 and the n-MOSFET 823, 833 are alternatingly turned on and off, wherein at each point in time only one of the p-MOSFET 822, 832 and the n-MOSFET 823, 833 of the same buffer stage 821, 831 is in the on-state.

The gate driver circuit 800 may further include a level shifter with a bootstrap diode for supplying the reference potential at the low potential line VL2 of the second buffer stage 830.

At least the p-MOSFET 822, 832 of one of the first and second buffer stages 821, 831 may have the configuration as described with any of the preceding figures. In particular, any of the semiconductor devices 100 in FIGS. 1 to 11C may be a gate driver circuit 800 as described with reference to FIG. 13.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   an insulator layer;
   a semiconductor layer formed on the insulator layer, the semiconductor layer comprising a first region of a first conductivity type, a second region of a second conductivity type, and a lightly doped extension region of the first conductivity type and separating the first region and the second region along a lateral x-axis; and
   a dielectric structure laterally surrounding the semiconductor layer,
   wherein at least one of the first region and the lightly doped extension region is formed at a distance to the dielectric structure along a lateral y-axis orthogonal to the x-axis, and
   wherein along the x-axis between the second region and the first region, a lateral extension of the semiconductor layer along the y-axis increases with increasing distance to the second region.

2. The semiconductor device of claim 1, further comprising:
   a source region of the first conductivity type,
   wherein the source region, the second region, the lightly doped extension region, and the first region are formed in this order along the x-axis.

3. The semiconductor device of claim 2, wherein the dielectric structure extends through the semiconductor layer and is in contact with the insulator layer.

4. The semiconductor device of claim 1, wherein the first region, the second region, and the lightly doped extension region extend from a first surface at a front side of the semiconductor layer to the insulator layer.

5. The semiconductor device of claim 1, further comprising:
   a non-insulating base formed at a side of the insulator layer opposite to the semiconductor layer.

6. The semiconductor device of claim 1, further comprising:
   a first spacer region that separates the first region and the dielectric structure along the y-axis,
   wherein the first spacer region is intrinsic or has the first conductivity type with an average net dopant concentration of at most 10% of an average net dopant concentration in the first region.

7. The semiconductor device of claim 6, further comprising:
   a second spacer region that separates the lightly doped extension region and the dielectric structure along the y-axis,
   wherein the second spacer region is intrinsic or has the first conductivity type with an average net dopant concentration of at most 10% of an average net dopant concentration in the lightly doped extension region.

8. The semiconductor device of claim 7, wherein the first spacer region and the second spacer region are in direct contact with each other.

9. The semiconductor device of claim 1, wherein the lightly doped extension region comprises a spacer portion between the first region and the dielectric structure along the y-axis.

10. The semiconductor device of claim 9, wherein the spacer portion of the lightly doped extension region is formed at a distance to the dielectric structure along the y-axis.

11. The semiconductor device of claim 1, wherein the lateral extension of the semiconductor layer along the y-axis increases with increasing distance to the second region from the second region to at least a center of the first region along the x-axis.

12. The semiconductor device of claim 11, wherein a width of the extension zone between an outer edge of the semiconductor layer and the first region is constant.

13. The semiconductor device of claim 12, wherein the width is at least 10% of a width of the extension region between the first region and the second region.

14. The semiconductor device of claim 1, wherein a spacer region separates the dielectric structure and the extension region.

15. The semiconductor device of claim 1, further comprising:
   an n-MOSFET comprising doped regions formed in a second semiconductor layer formed on the insulator layer,
   wherein the first region, the second region, and the lightly doped extension region form doped regions of a p-MOSFET, and
   wherein source/drain paths of the p-MOSFET and the n-MOSFET are electrically connected in series between a high potential line and a low potential line.

16. A semiconductor device, comprising:
   an insulator layer;
   a semiconductor layer formed on the insulator layer, the semiconductor layer comprising a first region of a first conductivity type, a second region of a second conductivity type, and a lightly doped extension region of the first conductivity type and separating the first region and the second region along a lateral x-axis;
   a dielectric structure laterally surrounding the semiconductor layer; and
   a first spacer region that separates the first region and the dielectric structure along the y-axis,
   wherein at least one of the first region and the lightly doped extension region is formed at a distance to the dielectric structure along a lateral y-axis orthogonal to the x-axis,
   wherein along the x-axis between the second region and the first region, a lateral extension of the semiconductor layer along the y-axis increases with increasing distance to the second region, and
   wherein the first spacer region is intrinsic or has the first conductivity type with an average net dopant concentration of at most 10% of an average net dopant concentration in the first region.

17. A semiconductor device, comprising:
   an insulator layer;
   a semiconductor layer formed on the insulator layer, the semiconductor layer comprising a first region of a first conductivity type, a second region of a second conductivity type, and a lightly doped extension region of the first conductivity type and separating the first region and the second region along a lateral x-axis;
   a dielectric structure laterally surrounding the semiconductor layer;
   a first spacer region that separates the first region and the dielectric structure along the y-axis; and
   a second spacer region that separates the lightly doped extension region and the dielectric structure along the y-axis,
   wherein at least one of the first region and the lightly doped extension region is formed at a distance to the dielectric structure along a lateral y-axis orthogonal to the x-axis, wherein along the x-axis between the second region and the first region, a lateral extension of the semiconductor layer along the y-axis increases with increasing distance to the second region, wherein the first spacer region is intrinsic or has the first conductivity type with an average net dopant concentration of at most 10% of an average net dopant concentration in the first region, and wherein the second spacer region is intrinsic or has the first conductivity type with an average net dopant concentration of at most 10% of an average net dopant concentration in the lightly doped extension region.

* * * * *